US010588212B1

(12) United States Patent
Gorin

(10) Patent No.: US 10,588,212 B1
(45) Date of Patent: Mar. 10, 2020

(54) PLASMA INITIATION IN AN INDUCTIVE RF COUPLING MODE

(71) Applicant: Georges J. Gorin, Novato, CA (US)

(72) Inventor: Georges J. Gorin, Novato, CA (US)

( * ) Notice: Subject to any disclaimer, the term of this patent is extended or adjusted under 35 U.S.C. 154(b) by 0 days.

(21) Appl. No.: 16/419,309

(22) Filed: May 22, 2019

(51) Int. Cl.
*H01H 1/46* (2006.01)
*H01J 37/32* (2006.01)
*H05H 1/46* (2006.01)

(52) U.S. Cl.
CPC ......... *H05H 1/46* (2013.01); *H05H 2001/466* (2013.01)

(58) Field of Classification Search
CPC ............. H05H 1/46; H05H 2001/4652; H05H 2001/4675; H05H 1/24; H05H 1/30; H05H 1/34; H01J 37/32; H01J 37/32357; H01J 37/3244; H01J 3732/449
See application file for complete search history.

(56) References Cited

U.S. PATENT DOCUMENTS 5,814,154 A 9/1998 Boitnott et al.
6,112,696 A * 9/2000 Gorin ................ H01J 37/32357 118/723 ER
6,692,649 B2 2/2004 Collison et al.
6,726,803 B2 4/2004 Kondo et al.
6,828,241 B2 12/2004 Kholodenko et al.
7,015,415 B2 3/2006 Gorin
7,303,982 B2 12/2007 Collins et al.
7,315,346 B2 1/2008 Van Beek et al.
7,393,432 B2 7/2008 Dhindsa et al.
8,012,306 B2 9/2011 Dhindsa et al.
8,723,143 B2 5/2014 Graupera et al.
9,386,677 B1 * 7/2016 Gorin ........................ H05H 1/46
2005/0178746 A1 * 8/2005 Gorin ................ H01J 37/32357 219/121.43
2012/0034137 A1 2/2012 Risby
2018/0294146 A1 * 10/2018 Kumar .............. H01J 37/32642

* cited by examiner

*Primary Examiner* — Thai Pham
(74) *Attorney, Agent, or Firm* — Kevin Roe

(57) ABSTRACT

A method, apparatus and system for initiating a plasma with a low pressure inductively coupled RF plasma to dissociate one or more gases, the method including supplying one or more gases from a source to an inductively coupled plasma discharge chamber; applying RF power to the plasma discharge chamber by capacitive coupling to dissociate the one or more gases and create a plasma; preventing increased contamination from the capacitive electrodes by confining the plasma with at least one constriction acting as an improved power density device; and withdrawing the dissociated one or more gases from the plasma discharge chamber through at least one constriction.

17 Claims, 15 Drawing Sheets

PLASMA INITIATION IN AN INDUCTIVE RF COUPLING MODE

BACKGROUND OF THE INVENTION

Field of the Invention

This invention relates to the use of a plasma or a glow discharge for dissociating one or more gases into reactive and non-reactive ionic species and reactive and non-reactive neutral species, and in particular, to initiating such a plasma.

Description of the Prior Art

Plasma apparatus can be divided into two broad categories, downstream or remote plasma and direct plasma. In downstream plasma, the article(s) are not immersed in the glow discharge, as it is in direct plasma. The result is a purely chemical and multi-directional process resulting in a somewhat more gentle treatment of the article(s) because high power electromagnetic waves at high frequency are not coupled through the article(s) and there is no heating from direct ion bombardment. In either type of apparatus, it is known in the art to employ some type of plasma for processing one or more article(s).

Typically, one or more reactive gases (such as air, oxygen-based gases, or halogen-based gases, including fluorine, chlorine, bromine, or other equivalent gases, as well as gas molecular compounds having one or more oxygen or halogen atoms), are used in combination with other gases, due to the highly reactive nature of the reactive gas(es) in a plasma chamber.

Inductive coupling or capacitive coupling can be used to couple radio-frequency (RF) electromagnetic energy to one or more gases for dissociation and creation of plasma. In this specification, drawings, and claims, radio-frequency (RF) is defined as any frequency of electromagnetic energy where inductive or capacitive coupling to a plasma can be implemented. A plasma source is defined as a device that can partially ionize a gas or a mixture of gas at a reduced pressure. The plasma produced can be a low temperature plasma, wherein the bulk gas temperature remain low (e.g., less than one hundred degrees Celsius to a few hundred degrees Celsius, more or less), while the electron temperature can be much higher (e.g., having a kinetic energy in the range of a few hundred electron volts (eV)). A non-thermal plasma is typically used in a vacuum pressure range of 20 Torr to 0.5 milliTorr, where one Torr is the amount of pressure to support a column of mercury one millimeter high at 0 degrees Celsius (approximately 1.316×10 exp−3 atmosphere in pressure).

What are Reactive Neutrals?

In one embodiment, the "radicals" (also called active neutrals, actives species, neutral species) have no electrical charge associated with them. The oxygen O radical, for example, can diffuse over a long distance (a few meters at 1 milliTorr) and still be chemically reactive.

Plasma Initiation Process:

The RF energy is transferred to the electrons. The electrons then partially dissociate and ionize the gas and generation of radicals occurs. This will convert un-reactive gas molecules into very reactive radicals. Most plasma surface chemistry is accomplished by radicals, such as the following examples (where "e−" represents an electron).

$$e{-}+O_2{=}{>}O+O+e{-} \quad (1)$$

$$e{-}+CF_4{=}{>}CF_3+F+e{-} \quad (2)$$

$$e{-}+SF_6{=}{>}SF_5+F+e{-} \quad (3)$$

$$e{-}+NF_3{=}{>}NF_2+F+e{-} \quad (4)$$

Ionization

Ionization of gas molecules will typically result in the production of ions and electrons, such as the following examples.

$$e{-}+O_2{=}{>}O_2^{+}2e{-} \quad (5)$$

$$e{-}+Cl_2{=}{>}Cl_2^{+}+2e{-} \quad (6)$$

$$e{-}+Ar{=}{>}Ar^{+}2e{-} \quad (7)$$

Dissociative Ionization

Dissociative ionization can also occur as well from one collision with an electron.

$$e{-}+CF_4{=}{>}CF_3^{+}+F+2e{-} \quad (8)$$

$$e{-}+SF_6{=}{>}SF_5^{+}+F+2e{-} \quad (9)$$

$$e{-}+O_2{=}{>}O^{+}+O+2e{-} \quad (10)$$

In summary, there are many applications for using non-thermal plasma, where Te>>Ti (where Te is the electron temperature, and Ti is the ion temperature). There are two methods used for the generation of non-thermal plasma when using a RF power source frequency below 100 Megahertz (MHz). One method uses inductively coupled plasma (ICP) and the other method uses capacitively coupled plasma (CCP). FIG. 1A and FIG. 1B provide some examples.

FIG. 1A illustrates a prior art inductively coupled plasma (ICP) system to generate a plasma. FIG. 1A includes a gas inlet 120 which supplies one or more gases to discharge chamber 111. Discharge chamber 111 also has one or more capillary tubes 110 to prevent plasma expansion into gas inlet 120. One or more radio-frequency (RF) energy sources 170 are coupled to inductor 115, which surrounds discharge chamber 111 (the windings behind the chamber 111 are not shown, but the inductor 115 is continuous around the chamber 111) and dissociates one or more gases passing through discharge chamber 111, which may be made of various materials (e.g., a dielectric material or an equivalent). The plasma 100 is generated in this ICP system by a high current RF energy source 170. Discharge chamber 111 is coupled to an article in a treatment chamber (not shown) by a constriction 118.

FIG. 1B illustrates a prior art capacitively coupled plasma (CCP) system to generate a plasma. FIG. 1B shows that the plasma 100 is generated in this prior art CCP system by a high voltage RF energy source 170 and two electrodes 102 in the plasma generating discharge chamber 111. The two electrodes 102 in the discharge chamber 111 dissociate one or more gases passing through discharge chamber 111, which may be made of various materials (e.g., a dielectric material or an equivalent).

FIG. 2 illustrates a prior art plasma generating system that has a gas inlet 120 which supplies one or more gases to discharge chamber 111. A metal or dielectric material 184 encloses gas inlet 120 and a dielectric layer 182 has small openings (e.g., holes, slots, or equivalent perforations) 180 to prevent plasma expansion upstream from discharge chamber 111 through gas inlet 120. One or more RF energy sources 170 are coupled to inductor 115, which surrounds discharge chamber 111 and dissociates one or more gases passing through discharge chamber 111. The discharge chamber walls 200 may be made of various materials (e.g., a dielectric material such as, ceramic, glass, Teflon, or an equivalent). Discharge chamber 111 is coupled to an article in a treatment chamber (not shown) by a constriction 118 enclosed by material 114.

FIG. 3 illustrates a prior art system that has a gas inlet 120 with a means to control backwards plasma expansion as it supplies one or more gases to discharge chamber 111. Discharge chamber 111 also has a dielectric layer 182 between the discharge chamber 111 and a first electrode 190. Both the first electrode 190 and a second electrode 192 are connected to one or more RF energy sources 170. One or more RF energy sources 170 provide the power to dissociate one or more gases passing through discharge chamber 111. The first electrode 190 can have shorter or longer lengths, but in this embodiment the first electrode 190 is extended so far as to partially reach inside a constriction 118 enclosed by material 114. Discharge chamber 111 is coupled to an article in a treatment chamber (not shown) by the constriction 118.

However, the implementation of the ICP mode in the prior art, relies not only on the plasma parameters but also on the capacitance formed between the turns of the coil. In view of the foregoing, what is needed is an improved method and apparatus to efficiently and selectively initiate an ICP plasma without increasing contamination. These and other objects and advantages of the invention will become apparent to those skilled in the art from the following detailed description of the invention and the accompanying drawings.

DETAILED DESCRIPTION OF THE PREFERRED EMBODIMENTS

The invention provides a method, an apparatus, and a system to concentrate and initiate a plasma. Various embodiments of the invention can be applied to biological applications, medical applications, chemical applications, electronic applications, and any other applications where plasma can be beneficially used.

The way in which the RF power source energy is transferred to the gas is by transferring the RF energy to the electrons (which are light enough to follow the RF field at these frequencies), while the ions formed by ionization from kinetic energy transfer from the electrons are energized by the average DC component formed in the plasma due to the difference in velocity, between electrons and ions, caused by their different mass. The electrons can follow the RF field, while the ions do not due to their higher mass, when the RF frequency used is greater than about 10 MHz.

Also, as will be seen later, in one embodiment this invention works in conjunction with an "improved power density" device operated in the ICP mode (e.g., as disclosed in U.S. Pat. No. 7,015,415), or with some other means of creating high power density plasma located at a pre-determined location within the plasma chamber with respect to the RF electrodes.

In one embodiment, when using a plasma source with an "improved power density" device, it was established that in addition to increasing power density, the improved power density device also allows plasma operation over a large range of pressures (from above 10 Torr to less than 1 milliTorr) and still maintains a higher plasma density at a specific location. This results in higher rate of dissociation and ionization of the process gas.

This higher plasma density and higher rate of dissociation and ionization is very important when applied in applications, such as cleaning of smaller and smaller feature sizes and channels of integrated circuits and microelectromechanical systems (MEMs) circuits. Since the loss of plasma density from collisions increases with smaller channels, it is important to be able to increase the supply of reactant to maintain a good throughput. Low pressure also allows for greater diffusion of the plasma downstream from the "improved power density" device.

The power density profile in the chamber containing the plasma can be easily observed by using a broad band optical emission detector. The brighter the light emission, the higher the power density at the observed location. The power density profile can also be observed by measuring the surface temperature of the plasma chamber's wall. The higher the temperature, the higher the power density.

Figure 1A:
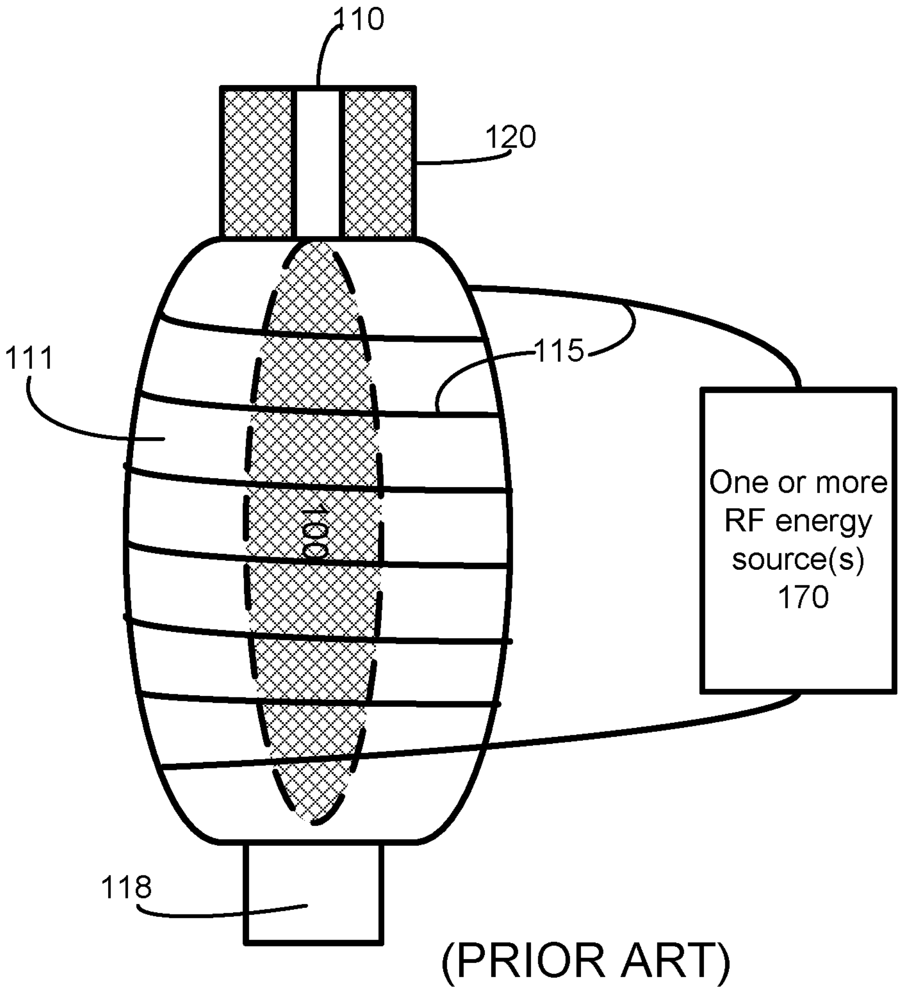
(PRIOR ART) FIG. 1A
FIG. 1A illustrates a prior art inductively coupled plasma (ICP) system to generate a plasma.
Figure 1B:
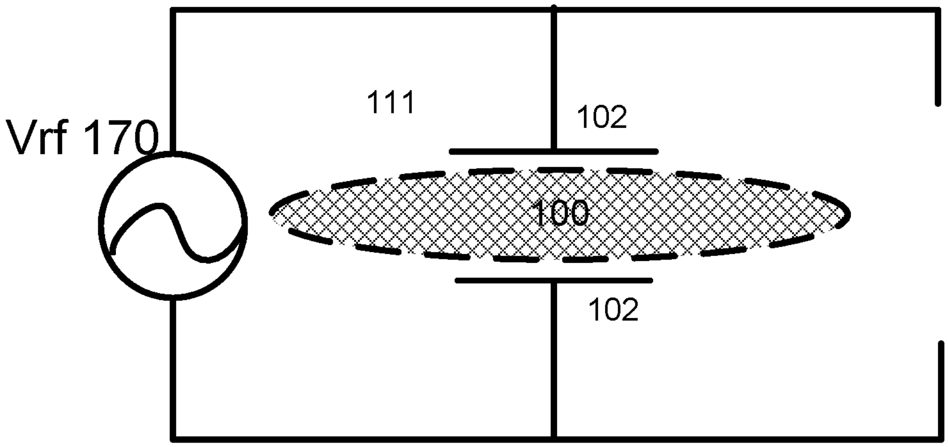
(PRIOR ART) FIG. 1B
FIG. 1B illustrates a prior art capacitively coupled plasma (CCP) system to generate a plasma.
Figure 2:
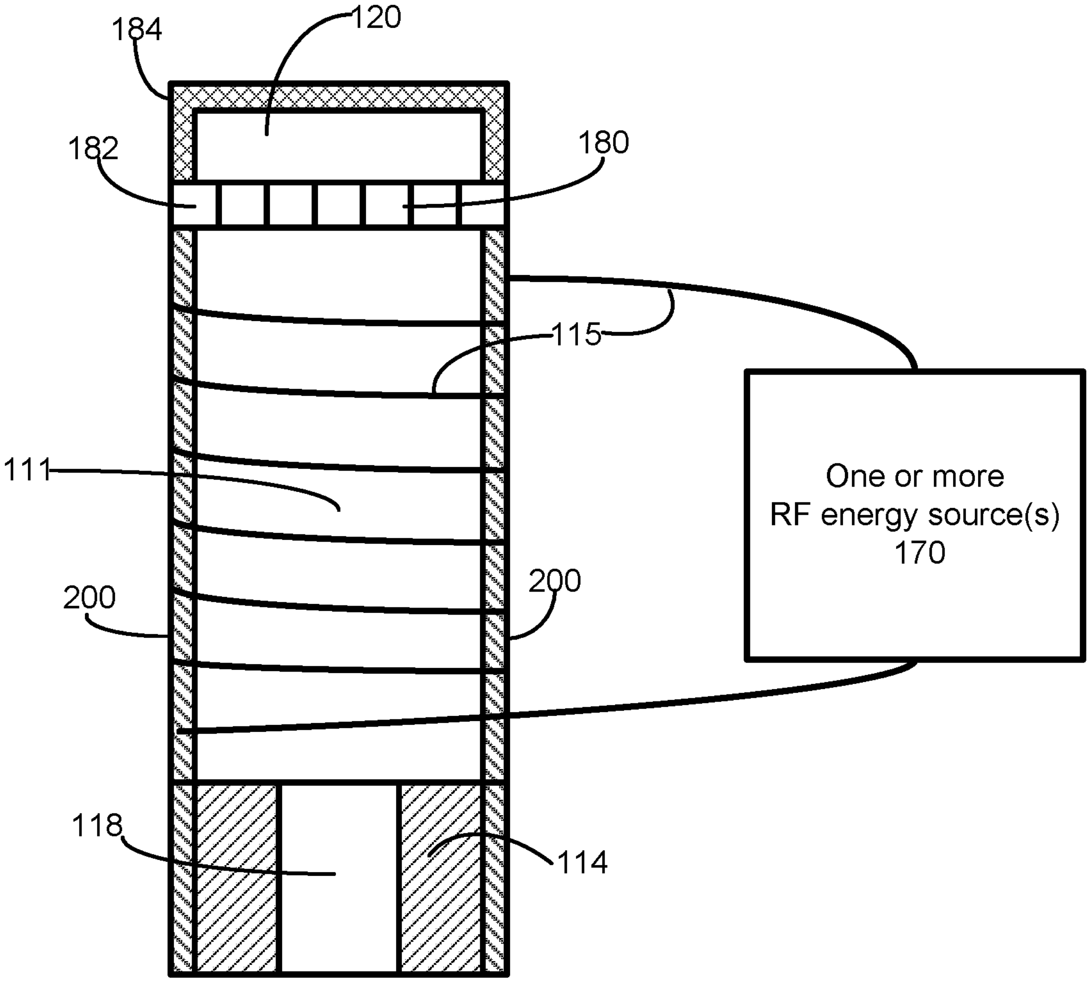
(PRIOR ART) FIG. 2
FIG. 2 illustrates a prior art system to generate a plasma.
Figure 3:
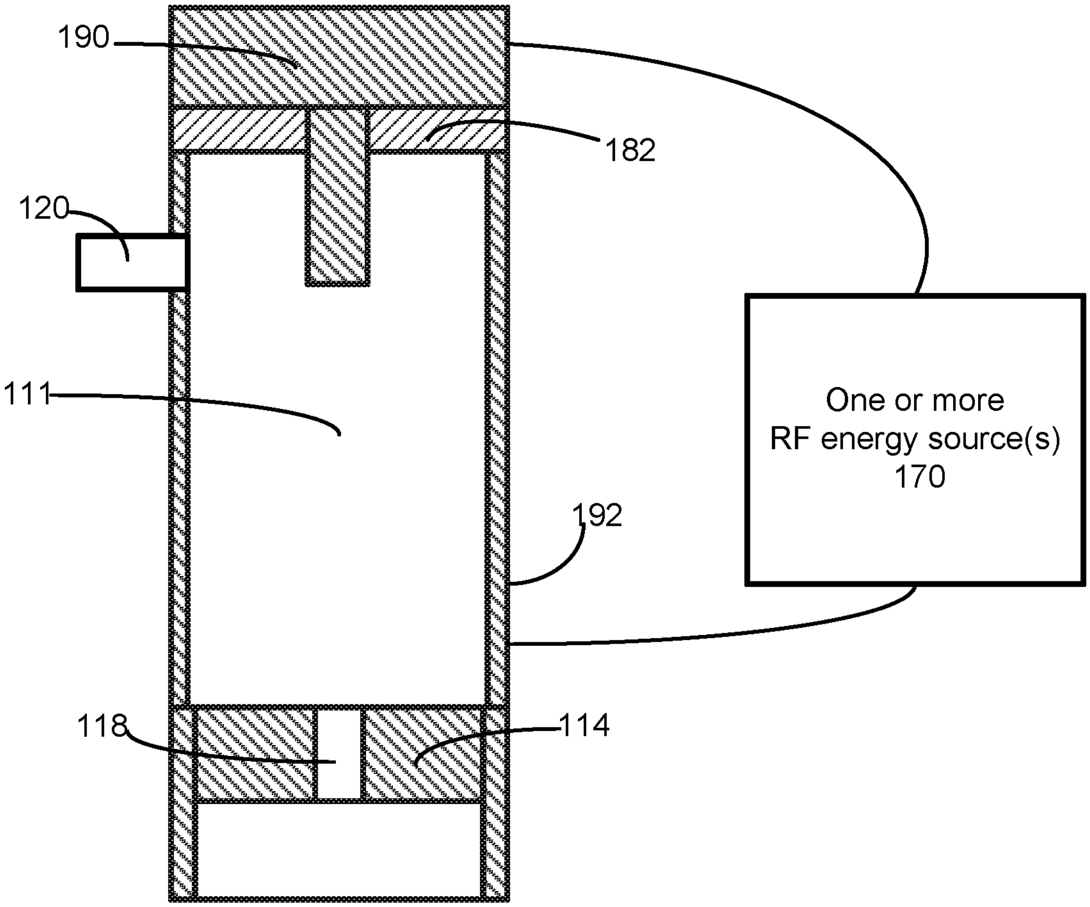
(PRIOR ART) FIG. 3
FIG. 3 illustrates a prior art system to generate a plasma.

Difference Between CCP and ICP:

FIG. 2 and FIG. 3 showed prior art implementations of ICP and CCP using a constriction at the exhaust of the plasma containing chamber to provide an "improved power density." But both of these coupling techniques have limitations, as described below. Capacitive coupling requires two electrodes (usually plates), with one electrode connected to the RF power source and the other electrode connected to the RF return of the RF power source, which is usually ground. The RF energy applied between these two electrodes is then transferred to the electrons by the electrical field (see equation 12 below).

The issue with CCP is that the electrical field been perpendicular with the capacitive electrodes, the small mass of the electrons allow them to travel from one electrode to the other during each half of the RF cycle, while the ions are drifting in the plasma. For each half RF cycle there is an excess of electrons at the electrodes. This creates an average negative DC voltage; which in turn, when the ions drift closer to the electrodes, will energize them in the direction of the electrodes and cause contamination from the surface of the electrodes.

As a result the kinetic energy of the ions and the electrons (see equations 12 and 13 below) must be kept below the sputtering levels of the material coming in contact with the plasma (also high energy electrons and ions can modify the electrical parameters of the samples being processed). CCP with low contamination works best at higher pressure (above 300 milliTorr), where the energy of both electrons and ions is reduced by collision from the shorter mean free path (see equation 11 below), reducing kinetic energy transfer (see equation 14 below), thus reducing contamination.

$$\text{Mean free path in air (cm)}=5/P \tag{11}$$

where P is the vacuum pressure in milliTorr.

$$\text{Energy stored in Capacitor}=E_c=\tfrac{1}{2}CV^2 \tag{12}$$

where E is the energy in joules, C is the capacitance in farads, V is the voltage in volts.

$$\text{Capacitance}=C=€A/D \tag{13}$$

where C is the capacitance in farads, € is the permittivity, D is the distance in meters, and A is the area of the plates facing each other in square meters.

The kinetic energy of the ions is given by (the same is true for the low mass electrons):

$$Ke=\tfrac{1}{2}\,mv^2 \tag{14}$$

where Ke is the kinetic energy in joules, m is the mass of the ion in kilograms, v is velocity of the ion in meters/second.

Inductive coupling is used to transfer RF energy to the electrons using a magnetic field. Once the magnetic flux is high enough (see equations 15 and 16 below), each electron's trajectory is modified by the magnetic flux, thus reducing their loss by collision with the walls of the plasma chamber. This reduction occurs because the strongest magnetic flux is located at the physical center of the coil, which is also the physical center of the plasma chamber. If the mean free path of the electrons is high enough, they can gather enough energy (see equation 15 below) to dissociate and ionize the process gas. For this reason, ICP is best used at low pressures (i.e., below 200 milliTorr).

$$\text{Energy store in an inductance}=E_1=\tfrac{1}{2}LI^2 \tag{15}$$

where Energy stored in an inductance is in joules, L is the inductance in henrys, I is the RF current in amperes.

$$\text{Inductance of a coil}=L=N(\Theta/I) \tag{16}$$

where L is the inductance in henrys, N is the number of turns of the coil, Θ is the magnetic flux in gauss, I is the RF current in amperes.

Difference in Plasma Initiation Between CCP and ICP:

With CCP, energy transfer is based on voltage between the capacitive electrodes, whereas with ICP, energy transfer is based on magnetic energy, which is a function of RF current in the inductance. When the RF power is first applied, there is no plasma, and the plasma impedance is high (R is very high) (see equation 17 below), keeping the RF current to a low value, resulting in a weak magnetic flux (see equation 15 above) for the ICP preventing its interaction with the electron. Since the plasma impedance is high, the voltage across the plasma electrodes is high, and that is why plasma initiation is easier to achieve in a CCP (see equation 12 above).

$$\text{impedance of the plasma } Z_p=R_p+jX_1-jX_c \tag{17}$$

where Zp is the impedance of the plasma in ohms, Rp is the resistance in ohms, X1 is the inductance reactance in ohms, Xc is the capacitance reactance in ohms.

How does plasma initiation occurs in an ICP? The answer is that there a small capacitor formed between the turns of the inductor (see equation 13 above), and this results in a capacitive type initiation described above. But not only the capacitance is low between turns, but also the voltage between turns is also lower than in the CCP case resulting in low energy transfer (see equation 12 above). Once the plasma initiates, then the RF impedance of the plasma decreases, the RF current increases and the magnetic field can affect the trajectory of electrons and the plasma is energized in the ICP mode.

Power Transfer from the RF Source to the Plasma Electrodes

Figure 4:
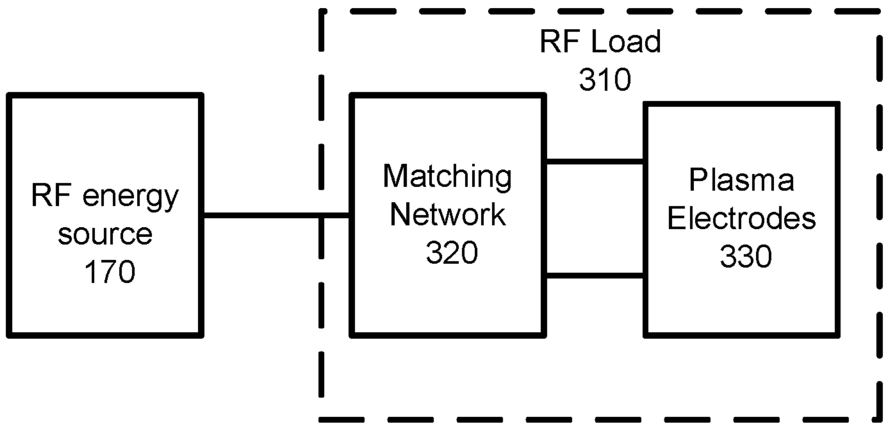
FIG. 4 illustrates an RF power delivery block diagram, in accordance with one embodiment of the invention.

FIG. 4 illustrates an RF load in accordance with one embodiment of the invention. An RF energy source 170 is coupled to an RF load 310, which is comprised of a matching network 320 and plasma electrodes 330. The matching network 320 is designed to give the RF load the impedance of 50 ohms, as seen by the RF energy source 170.

FIG. 4 also illustrates the power transfer from the RF source to the plasma electrodes. Commercially available RF sources are designed to transfer maximum RF power when the load connected (in one embodiment for a matching network and plasma electrodes) has a resistive impedance of 50 ohms. The impedance of the RF load can be expressed by the relation:

$$Z=R+JX_L-JX_c \tag{18}$$

where Z is the RF load impedance in ohms, R is the RF load resistance in ohms, $jX_1$ is the RF load inductive reactance in ohms, $jX_c$ is the RF load capacitive reactance in ohms. In one embodiment, for maximum power transfer from the generator, the RF load is: Z=R=50 ohms. For this reason, an RF circuit is needed between the plasma electrodes and the output of the RF generator to make the $jX_1=0$, $jX_c=0$ and R=50 ohms.

This RF circuit is called a "matching network." By monitoring the phase angle between RF voltage and RF current at the output of the RF source, it is possible to generate a signal to be used to bring the voltage and current into the same phase. This occurs only when $jX_1$ and $jX_c$ equal zero. The next requirement is to make Z=R=50 ohms. This is accomplished by measuring the RF current and the voltage at the output of the RF source after the difference in phase, between current and voltage, has been adjusted to zero.

Another circuit located at the output of the RF source measures the RF power delivered to the plasma load as well as the power coming back from the load. The difference between the two power levels is the amount of power absorbed by the plasma and the matching network (see equation 19 below).

$$RF \text{ power absorbed} = RF \text{ power delivered by the } RF \text{ source} - RF \text{ power coming back from the load} \quad (19)$$

where RF power is in watts, and the load is comprised of the matching network and plasma.

An additional variable to be taken into account is the fact that the designer of the RF source has to include some protection circuit in their design to prevent catastrophic failure of the output RF transistor when exposed to high RF power coming back from the load. If the RF power delivered by the RF source is not absorbed by the load, then the components of the RF source must dissipate that power and because this occurs at an impedance other than 50 ohms resistive, the voltage and the current will have different magnitudes based of the impedance of the load (see equation 18 above). This results in either high currents or high voltages that may exceed the safe parameter range of the RF output devices. For this reason, the RF power delivered by the RF source is reduced automatically to keep the output RF devices of the RF source in a safe parameter range.

Therefore, during the tuning period, the RF voltage and the RF current are changing at the RF electrodes and this causes the plasma density to vary (and the plasma may even turn ON and OFF) during the tuning sequence. For this reason, it is important that the tuning sequence be short and reproducible from run to run to minimize undesirable process variations.

One embodiment of this invention does not affect "power density," but when used in conjunction with an "improved power density" device, it provides a means to improve the "plasma initiation" by making it more repeatable and reliable when ICP is used. It also does not increase contamination above the contamination produced from the ICP, if any. As mentioned above, the need to process IC and MEMs circuits with smaller and smaller features size plus shallow cavity with deep recess, there is a need to operate the plasma processing at lower pressure. Another goal is to reduce the processing time to minimize production costs.

Figure 5:
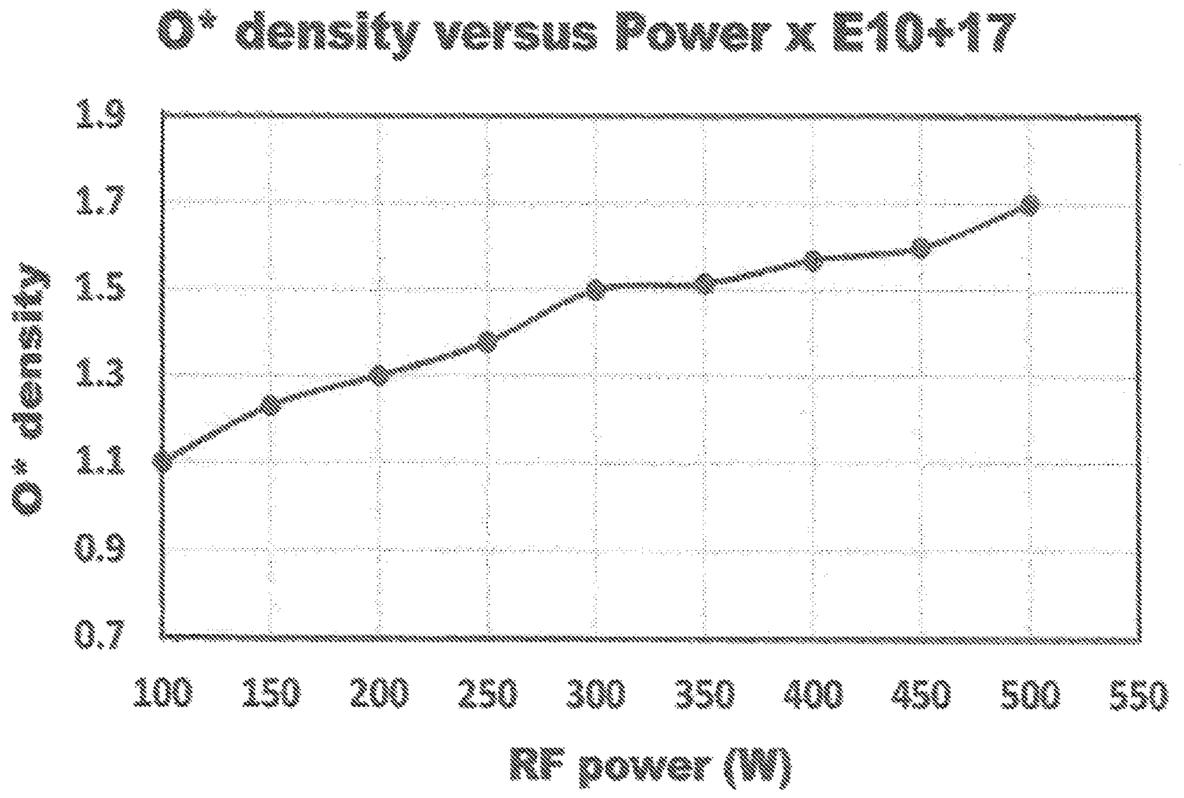
FIG. 5 illustrates the neutrals concentration versus the RF source power delivered, as obtained with a 2.54 mm diameter constriction, in accordance with one embodiment of the invention.

For these reasons, the ICP can be used with an "improved power density." This is compatible with small features size, low contamination and shorter process time because of the ability of this design to operate at lower RF power 20 watts to 15 watts to control contamination by lowering energies and low pressure (down to 0.5 milliTorr), while still maintaining a high density of radicals (see FIG. 5).

FIG. 5 illustrates the neutrals concentration versus the RF source power delivered, as obtained with a 2.54 mm diameter constriction, in accordance with one embodiment of the invention. More specifically, FIG. 5 shows a plot of the neutral density of oxygen, measured by actinometry (i.e., optical wavelength emission spectroscopy) with argon, versus the RF power. The neutral density of oxygen is plotted in units of 10 exp 17 ions on the vertical axis and the applied RF power is plotted on the horizontal axis in watts.

Figure 6:
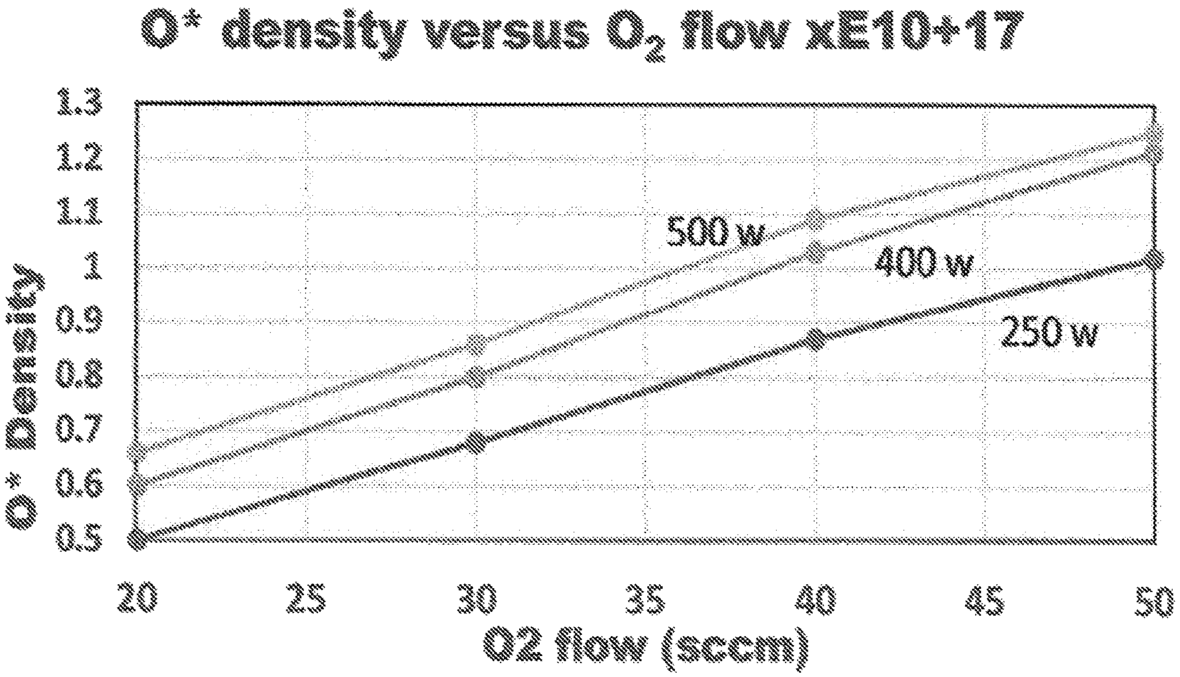
FIG. 6 illustrates a plot of the neutrals concentration as a function of gas flow and RF source power, in accordance with one embodiment of the invention.

The minimum pressure is function of the size of the vacuum pump and its capability to maintain flow rates above 15 standard cubic centimeters/minute (SCCM) to 25 SCCM at low pressure (between 10 milliTorr and 0.5 milliTorr) to provide enough reactive species. As shown in FIG. 6, the higher the gas flow, the higher the density of chemically reactive and un-reactive radicals.

FIG. 6 illustrates a plot of the neutrals concentration as a function of gas flow and RF source power, in accordance with one embodiment of the invention. More specifically, FIG. 6 shows a plot of the neutral density of oxygen, measured by actinometry with argon, versus molecular oxygen flow for three different RF power levels, in accordance with one embodiment of the invention. The neutral density of oxygen is plotted in units of 10 exp 17 ions on the vertical axis and molecular oxygen flow is plotted on the horizontal axis in SCCM. The top plot is for a RF power level of 550 watts, the middle plot is for a RF power level of 400 watts, and the lowest plot is for a RF power level of 250 watts.

In addition, the energy required to "initiate" the plasma depends on the plasma process parameters and the type of gas used. Highly electronegative gases (e.g., CF4, SF6, NF3), require higher energy than electropositive gases, (e.g., Ar), to initiate a plasma. Therefore, if this embodiment of an ICP is used, there is a limitation to the range of parameters and gas to be used, because of the reliance on the capacitance and voltage between turns of the inductance.

From a process reproducibility stand point, it is desirable to have a tuning period as short as possible so that the plasma will quickly achieve it's optimum process conditions. This tuning period must also be repeatable from run to run. The proposed solution to the above requirement has been to add a set of capacitive electrodes coupled to the RF input power side of the inductor to provide higher energy, by having a higher voltage across the two electrodes than the voltage between the turns of the inductor (see equation 12 above). These electrodes are placed on the gas inlet port side of the ICP's RF coil (see FIG. 7) so that the plasma can be initiated by the RF voltage and then switch to the ICP mode by the increase in the RF current (see FIG. 8 and FIG. 9).

Figure 7:
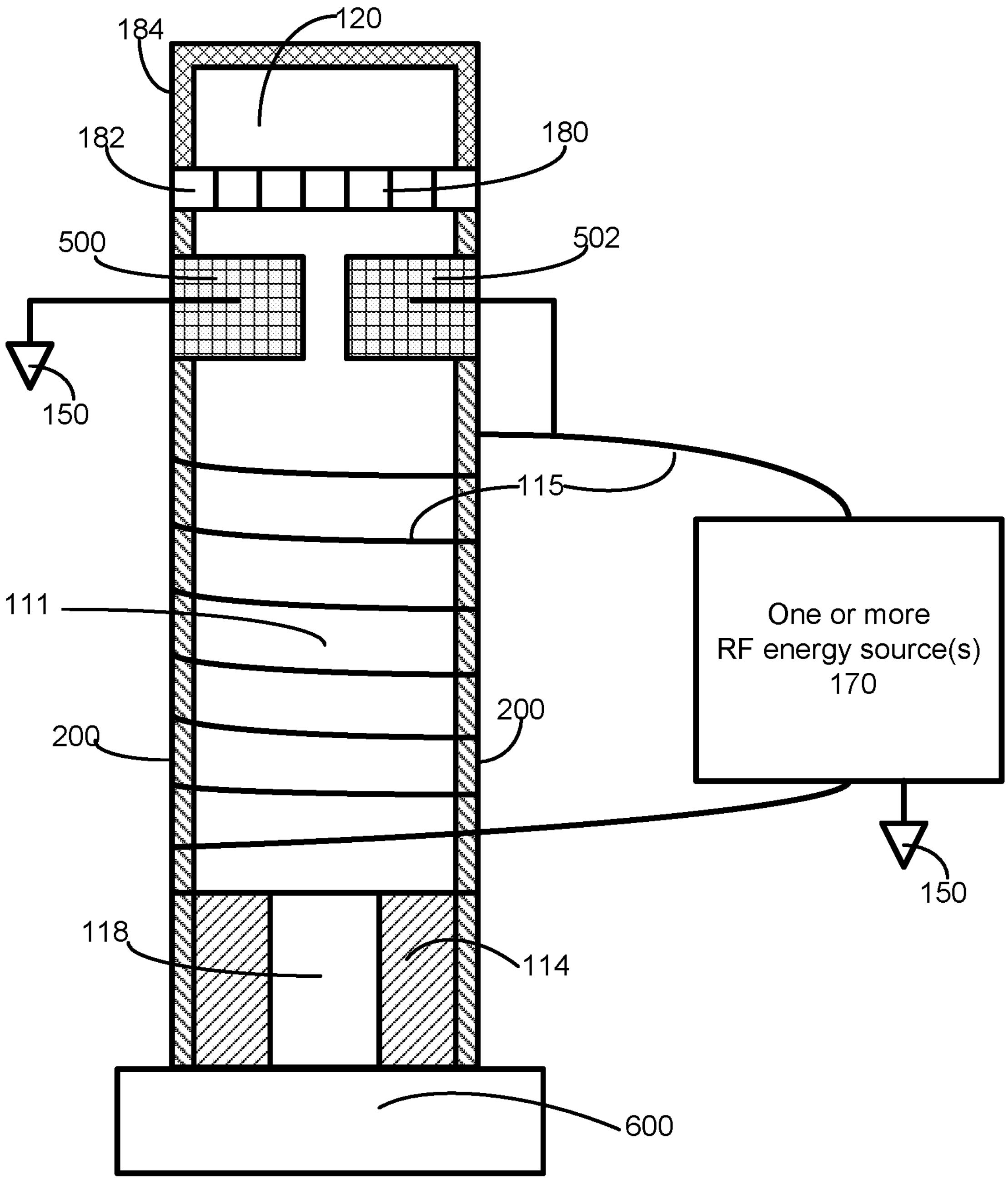
FIG. 7 illustrates the addition and relative location of a capacitive electrode set relative to the location of the inductor and the "improved power density device," in accordance with one embodiment of the invention.

FIG. 7 illustrates the addition and relative location of a capacitive electrode set relative to the location of the inductor and the "improved power density device," in accordance with one embodiment of the invention. The discharge chamber 111 has a gas inlet 120 which supplies one or more gases to discharge chamber 111. A metal or dielectric material 184 encloses gas inlet 120 and a dielectric or conductive (coated with a dielectric or not) layer 182 has small openings (e.g., holes, slots, or equivalent perforations) 180 to prevent plasma expansion upstream from discharge chamber 111 through gas inlet 120. One or more RF energy sources 170 are coupled to inductor 115, which surrounds discharge chamber 111 and dissociates one or more gases passing through discharge chamber 111 (for increased clarity, the windings behind the chamber 111 are not shown, but the inductor 115 is continuous around the chamber 111). The outer wall electrode 500 is coupled to the RF return which is usually ground 150, and the outer wall electrode 502 is coupled to the RF energy sources(s) 170. The discharge chamber walls 200 may be made of various materials (e.g., a dielectric material such as, ceramic, glass, Teflon, or an equivalent). Discharge chamber 111 is coupled to an article in a treatment chamber 600 by a constriction 118 enclosed by material 114.

In various embodiments of the invention, a pathway to the treatment chamber must always have a constriction, otherwise the gas flowing through the pathway without a constriction will be partially dissociated and the plasma relocation will only be partial. In various embodiments, the constriction 118 can be fabricated from non-conducting materials (e.g., quartz, glass, ceramics, Teflon, or a combination, or an equivalent material) to selectively concentrate the plasma inside the constriction 118. In another embodiment, the constriction 118 includes a metal or conductive coating combined with an inside or outside layer of dielectric.

In one embodiment an insulating material (e.g., silicon dioxide) is deposited inside constriction 118. In another embodiment the constriction 118 comprises a dielectric material (e.g., quartz, ceramic, Teflon, or a combination or an equivalent). Constriction 118 in one embodiment is within a removable insert, which can allow the constriction 118 to be disposable, easier to clean, and/or within a different material than the discharge chamber material.

The material used for constructing the constriction 118 in alternative embodiments can either be reactive or un-reactive with the plasma, as desired. In one embodiment of the invention, the plasma source would include a constriction in an insert, such as described in an earlier patent application by the same inventor, entitled "Higher Power Density Downstream Plasma," Ser. No. 10/781,226, filed on Feb. 18, 2004, and issued as U.S. Pat. No. 7,015,415 on Mar. 21, 2006, which is hereby incorporated by reference.

Figure 8:
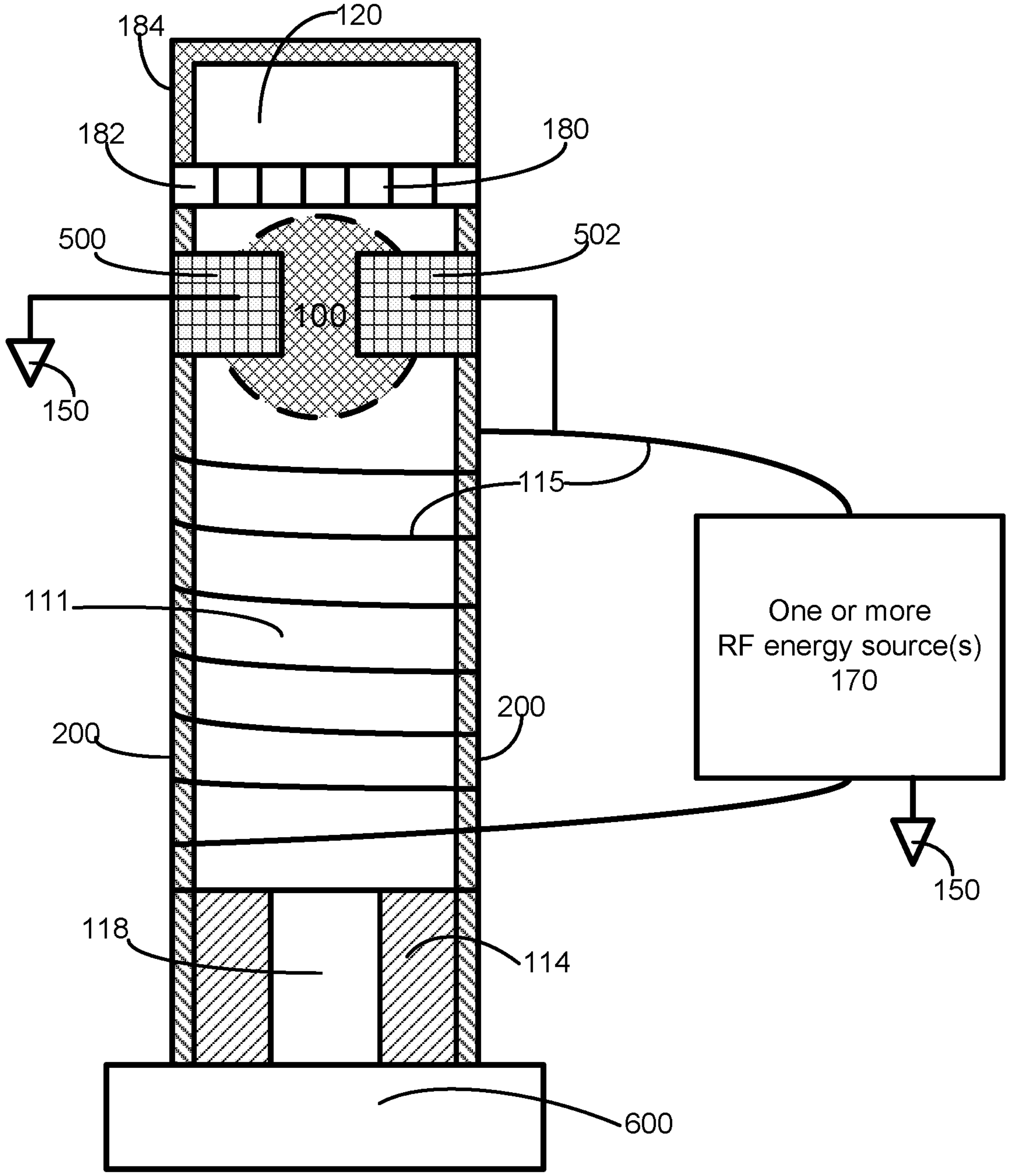
FIG. 8 illustrates the location of the plasma at initiation relative to the capacitive electrode set relative to the location of the inductor and the "improved power density device," in accordance with one embodiment of the invention.

FIG. 8 illustrates the location of the plasma at initiation relative to the capacitive electrode set relative to the location of the inductor and the "improved power density device," in accordance with one embodiment of the invention. The discharge chamber 111 has a gas inlet 120 which supplies one or more gases to discharge chamber 111. A metal or dielectric material 184 encloses gas inlet 120 and a dielectric or conductive (coated with a dielectric or not) layer 182 has small openings (e.g., holes, slots, or equivalent perforations) 180 to prevent plasma expansion upstream from discharge chamber 111 through gas inlet 120. One or more RF energy sources 170 are coupled to inductor 115, which surrounds discharge chamber 111 and dissociates one or more gases passing through discharge chamber 111 (the windings behind the chamber 111 are not shown, but the inductor 115 is continuous around the chamber 111). The outer wall electrode 500 is coupled to the RF return which is usually ground 150, and the outer wall electrode 502 is coupled to the RF energy sources(s) 170 in order to initiate the plasma 100. The discharge chamber walls 200 may be made of various materials (e.g., a dielectric material such as, ceramic, glass, Teflon, or an equivalent). Discharge chamber 111 is coupled to an article in a treatment chamber 600 by a constriction 118 enclosed by material 114.

Figure 9:
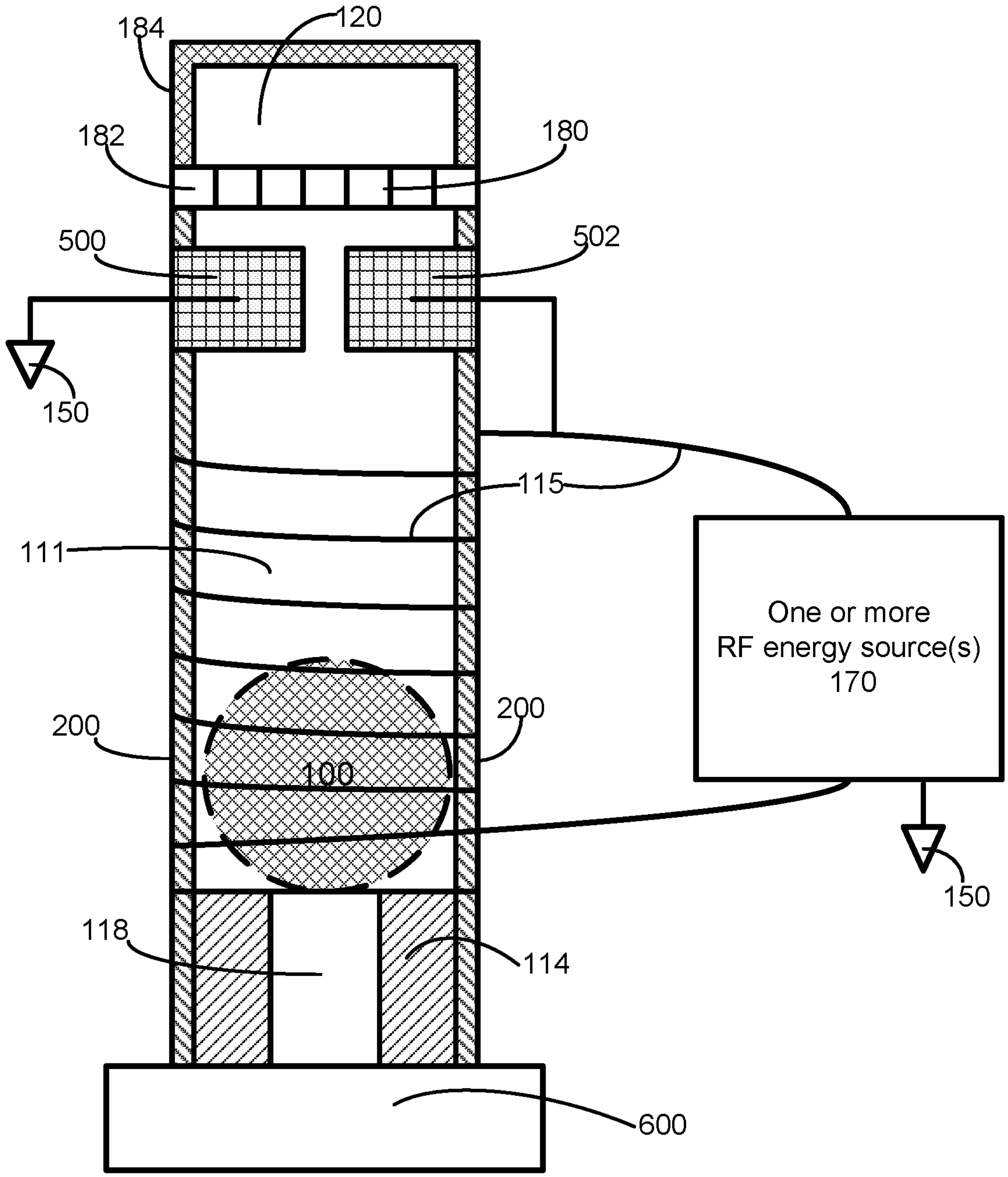
FIG. 9 illustrates the relocation of the plasma to the "improved power density device," in accordance with one embodiment of the invention.

FIG. 9 illustrates the relocation of the plasma to the "improved power density device," in accordance with one embodiment of the invention. The discharge chamber 111 has a gas inlet 120 which supplies one or more gases to discharge chamber 111. A metal or dielectric material 184 encloses gas inlet 120 and a dielectric or conductive (coated with a dielectric or not) layer 182 has small openings (e.g., holes, slots, or equivalent perforations) 180 to prevent plasma expansion upstream from discharge chamber 111 through gas inlet 120. One or more RF energy sources 170 are coupled to inductor 115, which surrounds discharge chamber 111 and dissociates one or more gases passing through discharge chamber 111 (the windings behind the chamber 111 are not shown, but the inductor 115 is continuous around the chamber 111). The outer wall electrode 500 is coupled to the RF return which is usually ground 150, and the outer wall electrode 502 is coupled to the RF energy sources(s) 170. The discharge chamber walls 200 may be made of various materials (e.g., a dielectric material such as, ceramic, glass, Teflon, or an equivalent). The initiated plasma 100 is shown near the end of the discharge chamber 111, which is coupled to an article in a treatment chamber 600 by a constriction 118 enclosed by material 114.

In various embodiments, the outer wall electrodes 500 and 502 are fabricated from one or more conducting metals (e.g., aluminum, stainless steel, copper, nickel-plated copper, or a combination, or an equivalent metal). In alternative embodiments, the constriction 118 can be fabricated from an insulating material (e.g., ceramic, silicon dioxide, Teflon, or an equivalent) and then selectively coated with a conducting metal.

It is essential to minimize or even eliminate the power dissipated between the added electrodes used for initiation of the plasma once the plasma is ignited, otherwise this would increase the level of contamination caused by capacitive coupling at low pressure as described in the earlier paragraphs describing the differences between CCP and ICP systems.

In one embodiment, an "improved power density" device is located at the plasma chamber exhaust of the ICP's coil and a distance away from the CCP electrodes. This insures that the power dissipated between the CCP electrodes after plasma initiation is low enough to be compatible with the need for low contamination.

As discussed below in regards to FIG. 10A and FIG. 10B, an adjustable capacitor can be wired in series with the capacitive electrodes to further adjust the equivalent value (see equation 20 below) of the capacitance and also provide a voltage divider to allow to change the voltage between the capacitive electrodes (see equation 21 below and FIG. 11). As seen in equation 12 above, changing the value of the capacitance does change the amount of energy stored in it.

$$C\text{equivalent}=(C_{ccp}C_{adj})/(C_{ccp}+C_{ccp}) \tag{20}$$

where Cequivalent is the equivalent capacitance in picofarads, $C_{ccp}$ is the capacitance of the plasma initiation's element electrodes in picofarads, $C_{adj}$ is the adjustable capacitor capacitance in picofarads.

The adjustable capacitor shown in FIG. 10A and FIG. 10B (discussed below in detail) allows an increased range of usable plasma parameters, since the amount of capacitive coupling needed to initiate the plasma without adding contamination will vary with plasma parameters and gas type (e.g., electropositive gas versus electronegative gas). This is important because the same plasma system is used for many processes and must handle many different recipes. The value of the variable capacitor can be set as part of the process recipe. Without an adjustable capacitor, it would be necessary to set the amount of capacitive coupling manually (e.g., by changing the area of the plasma initiation capacitor) to insure plasma initiation with the highest flow of electronegative gas and changing the amount of capacitive coupling again for a highly electropositive gas. An alternative would be to set the area of the capacitor for the highly electronegative gas and hope that this will not increase contamination when a high flow of electropositive gas is used, otherwise it would be necessary to use a lower RF power in the recipe to prevent increased contamination with electropositive gas and limiting the performance of the process and reducing the usable range of the plasma parameters.

Figure 10A:
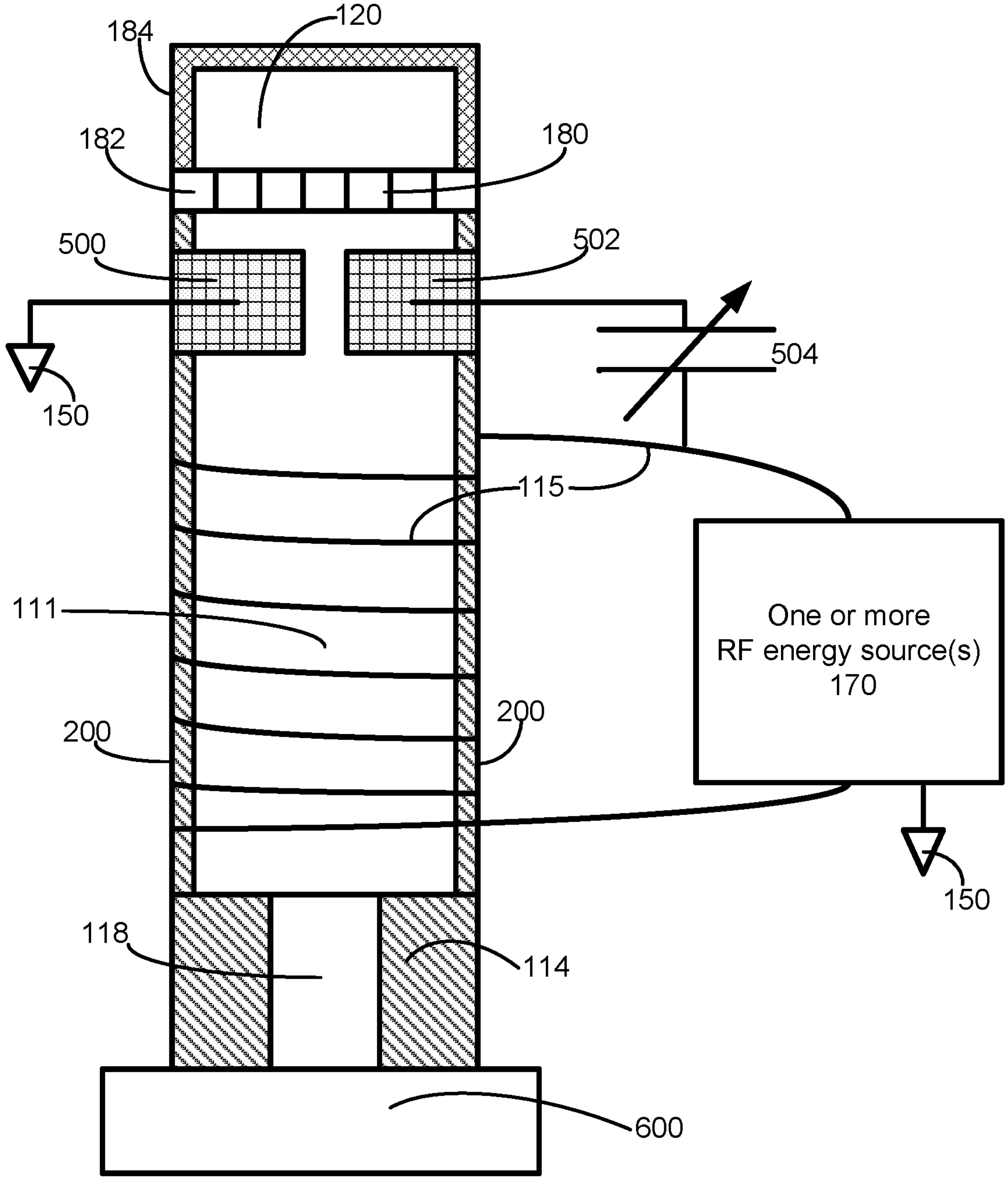
FIG. 10A illustrates a schematic of the addition of an adjustable capacitor placed in series with the initiation's capacitive electrodes, in accordance with one embodiment of the invention.

FIG. 10A illustrates a schematic of the addition of an adjustable capacitor placed in series with the initiation's capacitive electrodes, in accordance with one embodiment of the invention. The discharge chamber 111 has a gas inlet 120 which supplies one or more gases to discharge chamber 111. A metal or dielectric material 184 encloses gas inlet 120 and a dielectric or conductive (coated with a dielectric or not) layer 182 has small openings (e.g., holes, slots, or equivalent perforations) 180 to prevent plasma expansion upstream from discharge chamber 111 through gas inlet 120. One or more RF energy sources 170 are coupled to inductor 115, which surrounds discharge chamber 111 and dissociates one or more gases passing through discharge chamber 111 (the windings behind the chamber 111 are not shown, but the inductor 115 is continuous around the chamber 111). The outer wall electrode 500 is coupled to the RF return which is usually ground 150, and the outer wall electrode 502 is coupled to an adjustable capacitor 504 which is coupled to the RF energy sources(s) 170. The discharge chamber walls 200 may be made of various materials (e.g., a dielectric material such as, ceramic, glass, Teflon, or an equivalent). Discharge chamber 111 is coupled to an article in a treatment chamber 600 by a constriction 118 enclosed by material 114.

Figure 10B:
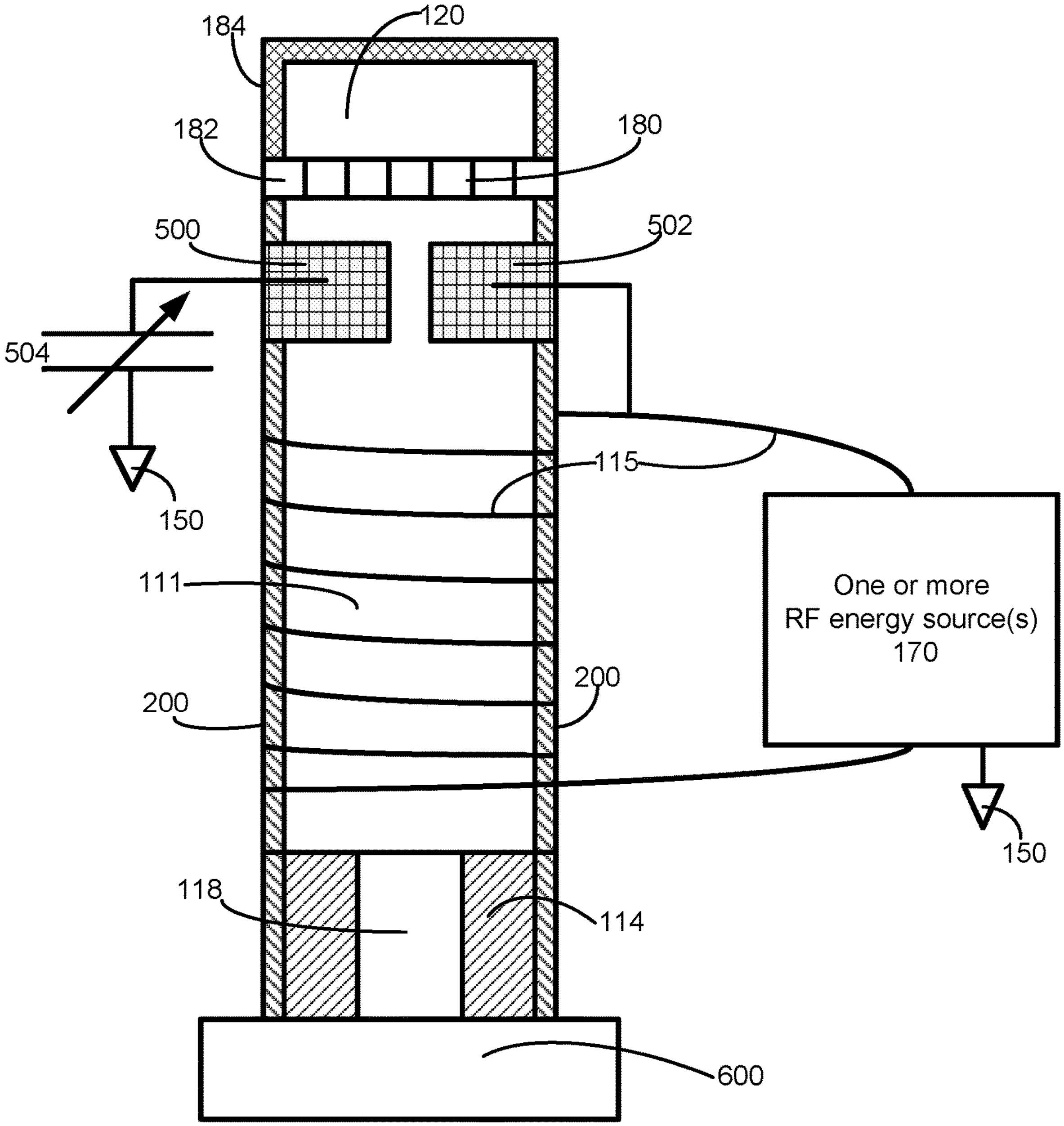
FIG. 10B illustrates a schematic of the addition of an adjustable capacitor placed in series with the initiation's capacitive electrodes, in accordance with another embodiment of the invention.

FIG. 10B illustrates a schematic of the addition of an adjustable capacitor placed in series with the initiation's capacitive electrodes, in accordance with another embodiment of the invention. The discharge chamber 111 has a gas inlet 120 which supplies one or more gases to discharge chamber 111. A metal or dielectric material 184 encloses gas inlet 120 and a dielectric layer 182 has small openings (e.g., holes, slots, or equivalent perforations) 180 to prevent plasma expansion upstream from discharge chamber 111 through gas inlet 120. One or more RF energy sources 170 are coupled to inductor 115, which surrounds discharge chamber 111 and dissociates one or more gases passing through discharge chamber 111 (the windings behind the chamber 111 are not shown, but the inductor 115 is continuous around the chamber 111). The outer wall electrode 500 is coupled to an adjustable capacitor 504 which is coupled to the RF return which is usually ground 150, and the outer wall electrode 502 is coupled to the RF energy sources(s) 170. The discharge chamber walls 200 may be made of various materials (e.g., a dielectric material such as, ceramic, glass, Teflon, or an equivalent). Discharge chamber 111 is coupled to an article in a treatment chamber 600 by a constriction 118 enclosed by material 114.

Figure 11:
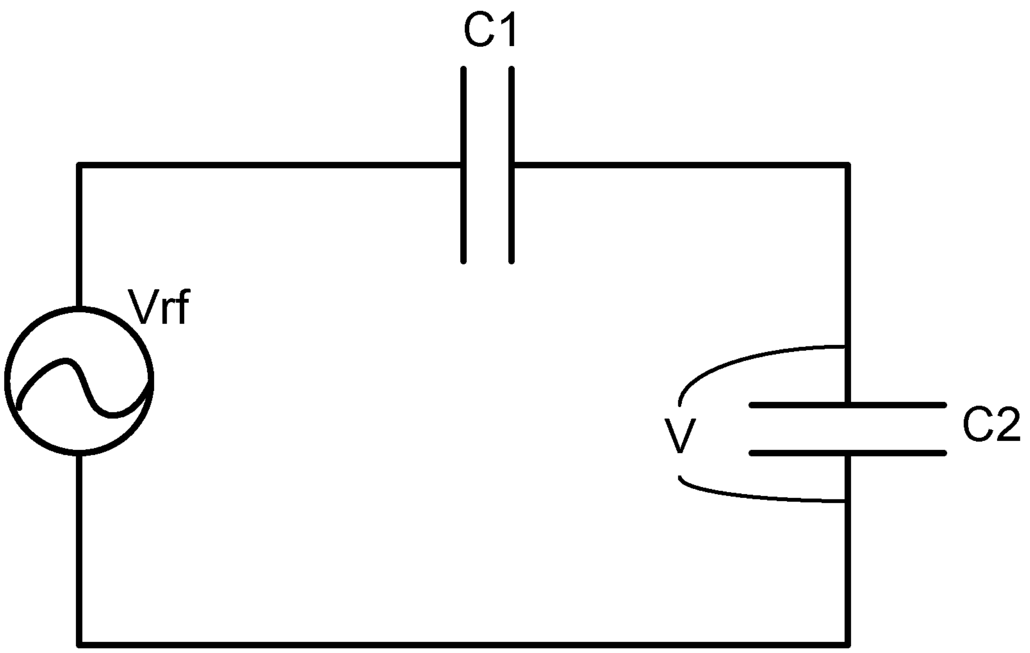
FIG. 11 illustrates a schematic of the voltage divider between capacitive electrodes and the adjustable capacitor which could be located at C1 or C2, in accordance with one embodiment of the invention.

FIG. 11 illustrates a schematic of the voltage divider between capacitive electrodes and the adjustable capacitor which could be located at C1 or C2, in accordance with one embodiment of the invention. As shown in FIG. 11, there is a voltage across the C2 capacitor that is a fraction of the Vrf voltage from the RF power source. See equations 21 and 22 below.

$$V \text{ across } C2 \text{ capacitor} = Vrf \text{ delivered times } (X2/(X1+X2)) \quad (21)$$

where V is in volts, Vrf in the RF source voltage in volts, X1=1/(2×Pi×frequency×C1 in farads) is the capacitor C1 impedance in ohms, X2=1/(2×Pi×frequency×C2 in farads) is the capacitor C2 impedance in ohms.

$$V \text{ across } C1 \text{ capacitor} = Vrf - V \text{ across } C2 \text{ capacitor} \quad (22)$$

where V is in volts, Vrf in the RF source voltage in volts.

Figure 12:
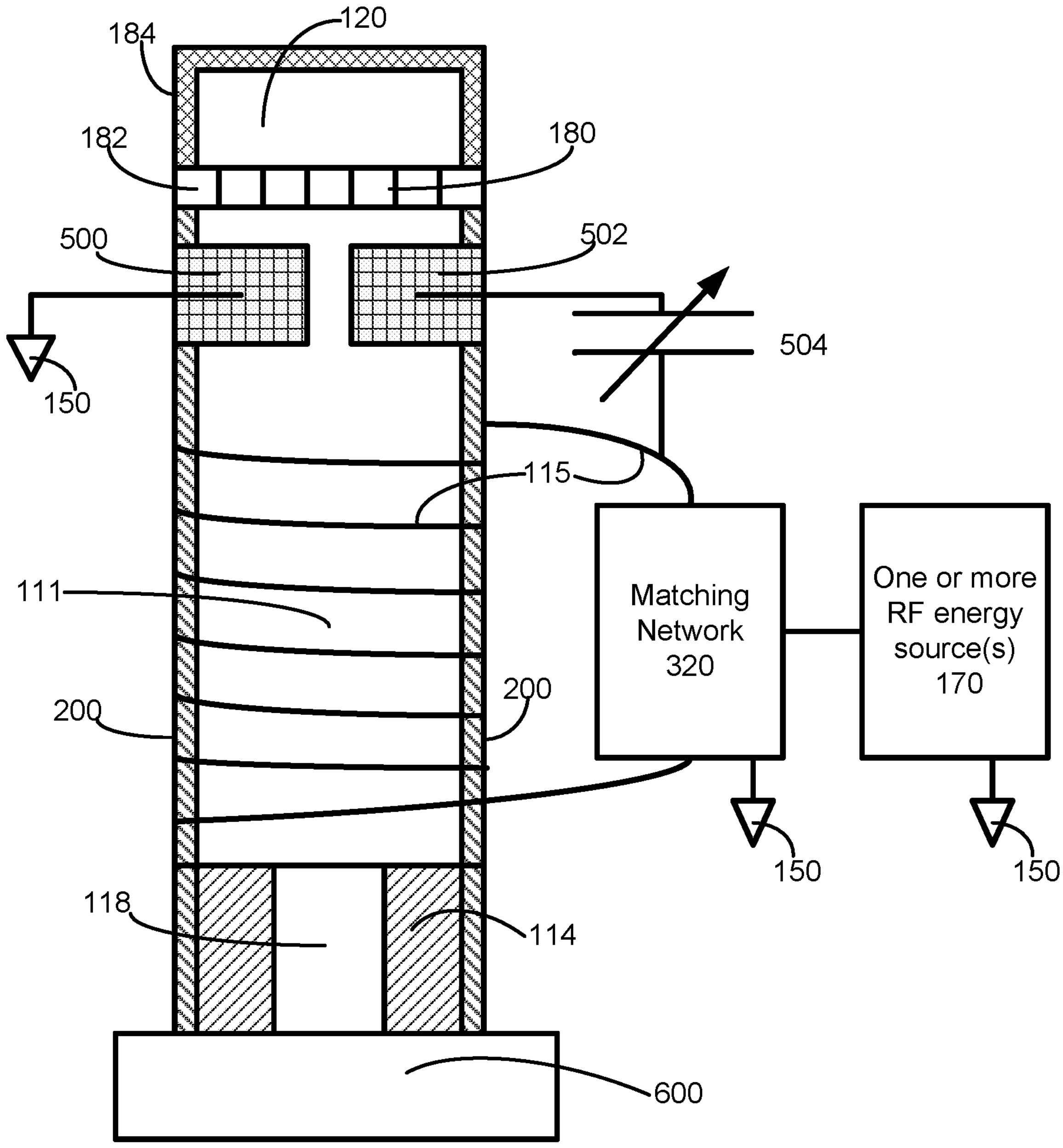
FIG. 12 illustrates a schematic of the addition of an adjustable capacitor placed in series with the initiation's capacitive electrodes and a matching network, in accordance with one embodiment of the invention.

FIG. 12 illustrates a schematic of the addition of an adjustable capacitor placed in series with the initiation's capacitive electrodes, in accordance with one embodiment of the invention. The discharge chamber 111 has a gas inlet 120 which supplies one or more gases to discharge chamber 111. A metal or dielectric material 184 encloses gas inlet 120 and a dielectric or conductive (coated with a dielectric or not) layer 182 has small openings (e.g., holes, slots, or equivalent perforations) 180 to prevent plasma expansion upstream from discharge chamber 111 through gas inlet 120. One or more RF energy sources 170 are coupled through a matching network 320 to inductor 115, which surrounds discharge chamber 111 and dissociates one or more gases passing through discharge chamber 111 (the windings behind the chamber 111 are not shown, but the inductor 115 is continuous around the chamber 111). The outer wall electrode 500 is coupled to the RF return which is usually ground 150, and the outer wall electrode 502 is coupled to an adjustable capacitor 504 which is coupled to the matching network 320. The discharge chamber walls 200 may be made of various materials (e.g., a dielectric material such as, ceramic, glass, Teflon, or an equivalent). Discharge chamber 111 is coupled to an article in a treatment chamber 600 by a constriction 118 enclosed by material 114.

Figure 13:
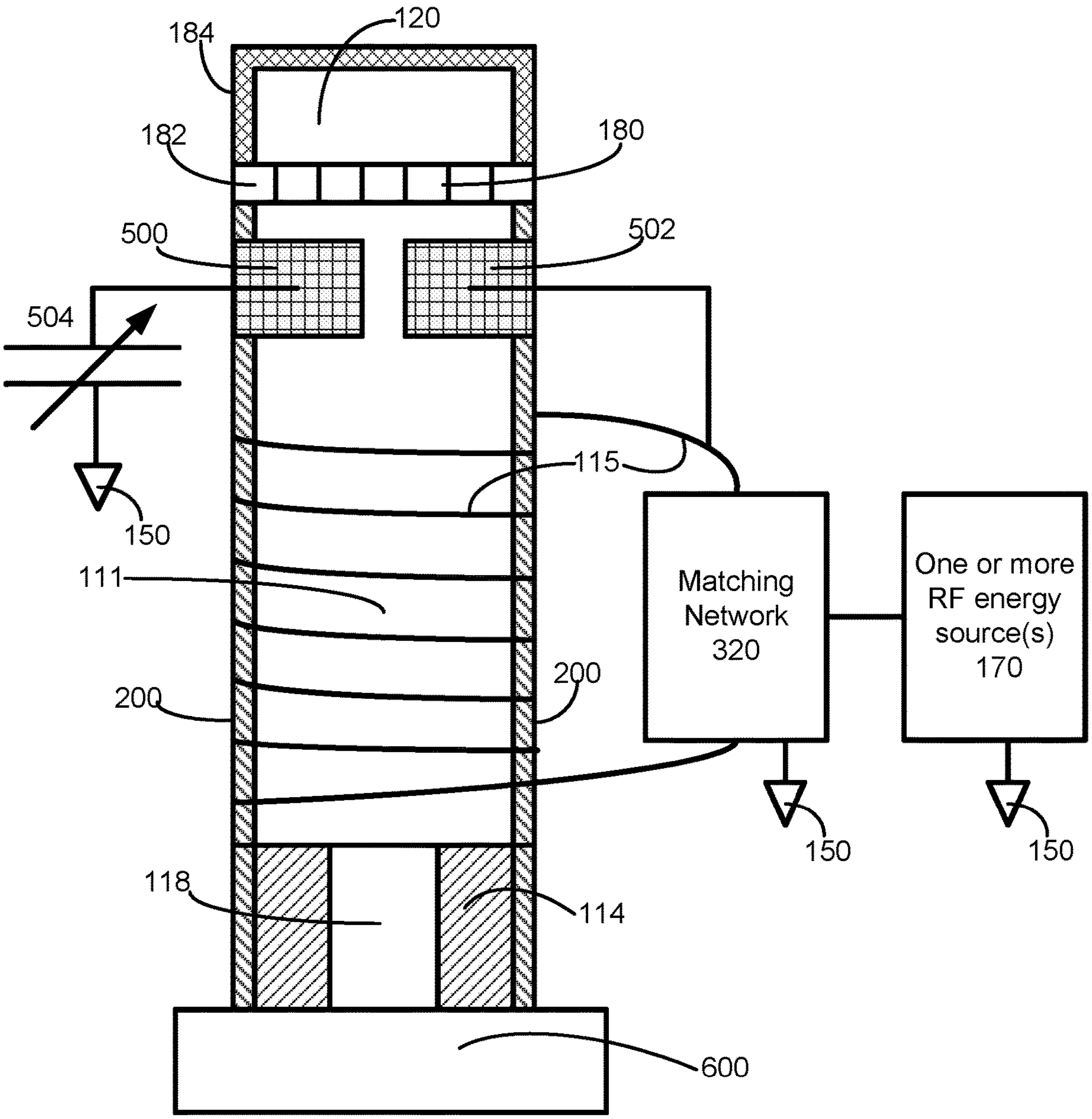
FIG. 13 illustrates a schematic of the addition of an adjustable capacitor placed in series with the initiation's capacitive electrodes and a matching network, in accordance with another embodiment of the invention.

FIG. 13 illustrates a schematic of the addition of an adjustable capacitor placed in series with the initiation's capacitive electrodes, in accordance with one embodiment of the invention. The discharge chamber 111 has a gas inlet 120 which supplies one or more gases to discharge chamber 111. A metal or dielectric material 184 encloses gas inlet 120 and a dielectric or conductive (coated with a dielectric or not) layer 182 has small openings (e.g., holes, slots, or equivalent perforations) 180 to prevent plasma expansion upstream from discharge chamber 111 through gas inlet 120. One or more RF energy sources 170 are coupled through a matching network 320 to inductor 115, which surrounds discharge chamber 111 and dissociates one or more gases passing through discharge chamber 111 (the windings behind the chamber 111 are not shown, but the inductor 115 is continuous around the chamber 111). The outer wall electrode 502 is coupled to the matching network 320, and the outer wall electrode 500 is coupled through adjustable capacitor 504 to the RF return which is usually ground 150. The discharge chamber walls 200 may be made of various materials (e.g., a dielectric material such as, ceramic, glass, Teflon, or an equivalent). Discharge chamber 111 is coupled to an article in a treatment chamber 600 by a constriction 118 enclosed by material 114.

In one embodiment of the invention, another benefit is the prevention of the loss of plasma during variations in electronegativity of the gas (e.g., changing flows of electronegative gas or adding a new electronegative gas to the process gas), abrupt decreases in power due to RF matching network re-tuning, or an increase in gas pressure. Each of these events result in a decrease in the power dissipated at the "improved power density" device. This decrease in the power dissipated also results in an increase of the power dissipated in the initiation circuit (by capacitive coupling), which helps to sustain the plasma and allow the plasma to return to its previous state and conditions after such a disturbance passes, or once the control circuits of the system have completed tuning.

It should be noted that various embodiments of this invention are distinctive and should not be confused with other prior art plasma reactor disclosures (e.g., U.S. Pat. No. 4,464,223, and other patents regarding high density ICP and ECR) that use a dual electrode set. The purpose of these prior art disclosures was different, and their goals was to provide some separation between gas dissociation and ionization (plasma density) and ion energy bombarding the surface of a sample. In one embodiment, this invention also uses a two electrode set, but one electrode is used for plasma initiation and the other electrode is used for plasma density. Another distinctive hardware difference is that one embodiment of the invention can use one RF power source per plasma, or one RF power source for multiple plasmas, whereas the other prior art disclosures require two RF power sources (one RF power source for plasma density and one RF power source for ion energy).

Figure 14:
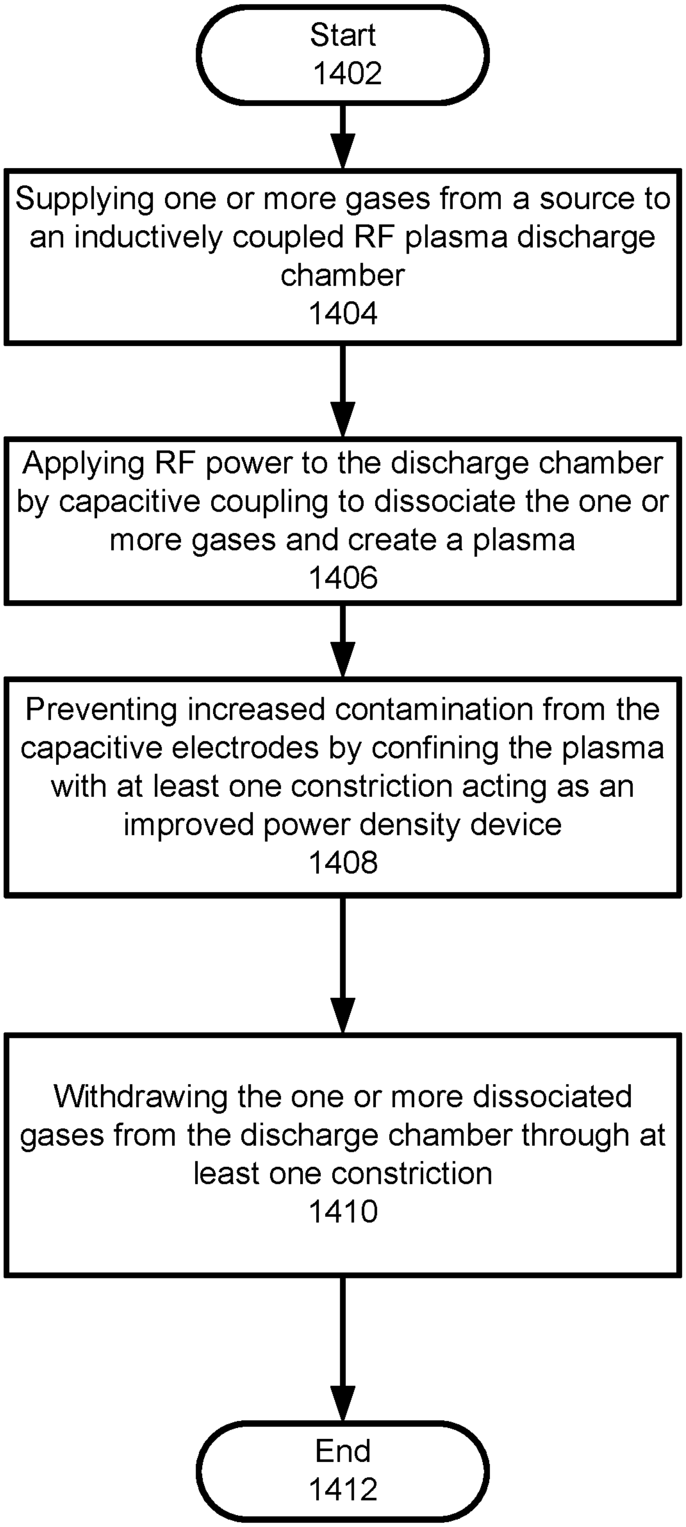
FIG. 14 illustrates a flowchart of a method to initiate a plasma, according to one embodiment of the invention.

FIG. 14 illustrates a flowchart of a method to initiate plasma, according to one embodiment of the invention. The sequence starts in operation 1402. Operation 1404 includes supplying one or more gases from a source to an inductively coupled RF plasma discharge chamber. This operation in some embodiments of the invention would include using a means for controlling (i.e., reducing or preventing) expansion of plasma back through the gas supply lines from the plasma discharge chamber. Operation 1406 includes applying RF power to the plasma discharge chamber by capacitive coupling to dissociate one or more gases and create a plasma. Operation 1408 includes preventing increased contamination from the capacitive electrodes by confining the plasma with at least one constriction acting as an improved power density device. Operation 1410 includes withdrawing the one or more dissociated gases from the plasma discharge chamber through at least one constriction. In one embodiment, the gas pressure can be as low as 1 milliTorr or less. The method ends in operation 1412.

The exemplary embodiments described herein are for purposes of illustration and are not intended to be limiting. Therefore, those skilled in the art will recognize that other embodiments could be practiced without departing from the scope and spirit of the claims set forth below.

What is claimed is:

1. A method for initiating a plasma with a low pressure inductively coupled RF plasma to dissociate one or more gases, the method comprising:

supplying one or more gases from a source to an inductively coupled plasma discharge chamber;

applying RF power to the plasma discharge chamber by capacitive coupling to dissociate the one or more gases and create a plasma, including applying RF power to the plasma discharge chamber by one or more electrodes coupled through an adjustable capacitor;

preventing increased contamination from the capacitive electrodes by confining the plasma with at least one constriction acting as an improved power density device; and withdrawing the dissociated one or more gases from the plasma discharge chamber through the at least one constriction.

2. The method of claim 1, further comprising:

providing a capacitive means to initiate a plasma without increasing contamination, by relocating the RF power delivered to and absorbed by the plasma away from the capacitor used by plasma initiation.

3. The method of claim 1, wherein the material making the constriction includes a material that is reactive or non-reactive with the one or more gases used in the plasma discharge chamber.

4. The method of claim 1, further comprising:

providing a means to adjust the amount of capacitive coupling provided by a pair of capacitive electrodes to minimize contamination at low pressure without changing the physical configuration of the pair of capacitive electrodes.

5. The method of claim 1, further comprising:

providing a means to minimize the electron energy in a plasma initiation sequence by providing a voltage divider to reduce the voltage across the capacitor electrodes used for initiation of the plasma.

6. An apparatus for dissociating one or more gases to produce a plasma, the apparatus comprising:

a plasma discharge chamber coupled to a source of one or more gases;

one or more RF energy sources to supply RF power coupled by inductive coupling to the plasma discharge chamber;

one or more electrodes coupled through an adjustable capacitor coupled to the RF energy sources and the plasma discharge chamber, including at least one pair of capacitive electrodes in proximity to the plasma discharge chamber;

at least one constriction acting as an improved power density device in at least one pathway coupled to the plasma discharge chamber; and a treatment chamber coupled to the plasma discharge chamber through the at least one pathway to receive the plasma, wherein the treatment chamber can contain one or more articles, wherein the at least one constriction selectively increases the power density of the plasma in the at least one constriction by using a narrower cross-section to concentrate the plasma.

7. The apparatus of claim 6, further comprising:

a capacitive means to initiate a plasma without increasing contamination, by relocating the RF power delivered to and absorbed by the plasma away from the capacitor used by plasma initiation.

8. The apparatus of claim 6, further comprising:

a voltage divider module to minimize the electron energy in a plasma initiation sequence, wherein the voltage divider module reduces the voltage across the capacitor electrodes used for initiation of the plasma.

9. The apparatus of claim 6, further comprising:

a means to adjust the amount of capacitive coupling provided by a pair of capacitive electrodes to prevent increased contamination at low pressure without changing the physical configuration of the pair of capacitive electrodes.

10. The apparatus of claim 6, further comprising:

a means to minimize the electron energy in a plasma initiation sequence by providing a voltage divider to reduce the voltage across the capacitor electrodes used for initiation of the plasma.

11. The apparatus of claim 6, wherein the material making the constriction includes a material that is reactive with at least one gas of the one or more gases used in the plasma discharge chamber.

12. The apparatus of claim 6, wherein the material making the constriction includes a material that is non-reactive with the one or more gases used in the plasma discharge chamber.

13. A system to dissociate one or more gases to produce plasma, the system comprising:

a plasma discharge chamber wherein the plasma discharge chamber is coupled to a source of one or more gases;

one or more RF energy sources to supply RF power inductively coupled to the plasma discharge chamber;

one or more electrodes coupled through an adjustable capacitor, wherein the one or more electrodes are coupled to the RF energy sources and the plasma discharge chamber, including at least one pair of capacitive electrodes in proximity to the plasma discharge chamber, coupled to the one or more RF energy sources;

a constriction acting as an improved power density device; and a treatment chamber coupled to the plasma discharge chamber through the constriction to receive the plasma, wherein the treatment chamber can contain one or more articles, wherein the constriction selectively increases the power density of the plasma by using a cross-sectional area smaller than the plasma discharge chamber to concentrate the plasma.

14. The system of claim 13, further comprising:

a pair of capacitive electrodes to initiate a plasma without increasing contamination, by relocating the RF power delivered to and absorbed by the plasma away from the pair of capacitive electrodes used for plasma initiation.

15. The system of claim 13, wherein the material making the constriction includes a material that is reactive with at least one gas used in the plasma discharge chamber.

16. The system of claim 13, further comprising:

a pair of capacitive electrodes to adjust the amount of capacitive coupling, wherein the pair of capacitive electrodes prevent increased contamination at low pressure without changing the physical configuration of the pair of capacitive electrodes around the plasma discharge chamber.

17. The system of claim 13, further comprising:

a voltage divider module to minimize the electron energy in a plasma initiation sequence, wherein the voltage divider module reduces the voltage across the capacitor electrodes used for initiation of the plasma.

* * * * *